United States Patent [19]

Havens

[11] Patent Number: 5,175,033
[45] Date of Patent: Dec. 29, 1992

[54] METALLIZED BAG WITH IMPROVED INTERLAYER ADHESION FOR STATIC PROTECTION OF ELECTRONIC COMPONENTS

[75] Inventor: Marvin R. Havens, Greer, S.C.

[73] Assignee: W. R. Grace & Co.-Conn., Duncan, S.C.

[21] Appl. No.: 542,863

[22] Filed: Jun. 22, 1990

[51] Int. Cl.$^5$ ............................................. B65D 73/02
[52] U.S. Cl. ................................... 428/35.3; 428/35.8; 428/35.9; 428/457; 428/461; 428/463; 428/922; 206/328
[58] Field of Search ...................... 428/35.3, 457, 461, 428/463, 922, 216, 35.8, 35.9; 206/328

[56] References Cited

U.S. PATENT DOCUMENTS

| | | | |
|---|---|---|---|
| 3,085,025 | 4/1963 | Eaton | 117/9 |
| 3,221,145 | 11/1965 | Hager, Jr. | 219/549 |
| 3,540,921 | 11/1970 | Ward et al. | 117/122 |
| 3,572,499 | 3/1971 | Mondano | 206/1 |
| 3,801,418 | 4/1974 | Cornelis et al. | 161/43 |
| 3,852,151 | 12/1974 | Knapp | 161/162 |
| 3,916,048 | 10/1975 | Walles | 428/35 |
| 4,109,052 | 8/1978 | Anderson | 409/409 |
| 4,154,344 | 5/1979 | Yenni, Jr. et al. | 206/524 |
| 4,156,751 | 5/1979 | Yenni, Jr. et al. | 428/212 |
| 4,166,876 | 9/1979 | Chiba et al. | 428/215 |
| 4,232,901 | 11/1980 | Berbeco | 252/511 |
| 4,307,144 | 12/1981 | Sanders et al. | 428/240 |
| 4,322,003 | 3/1982 | Long | 206/525 |
| 4,345,000 | 8/1982 | Kawazoe et al. | 428/212 |
| 4,363,841 | 12/1982 | Snow | 428/35 |
| 4,405,678 | 9/1983 | Downing et al. | 428/215 |
| 4,407,872 | 10/1983 | Horii | 428/35 |
| 4,414,254 | 11/1983 | Owata et al. | 428/34 |
| 4,424,900 | 1/1984 | Petcavich | 206/328 |
| 4,480,747 | 11/1984 | Kazor et al. | 206/334 |
| 4,496,406 | 1/1985 | Dedow | 156/66 |
| 4,528,234 | 7/1985 | Kaiho et al. | 428/216 |
| 4,553,190 | 11/1985 | Mueller | 361/212 |
| 4,554,210 | 11/1985 | Long et al. | 428/349 |
| 4,559,257 | 12/1985 | Nilsson | 428/152 |
| 4,623,594 | 11/1986 | Keough | 428/500 |
| 4,629,640 | 12/1986 | Akao | 428/35 |
| 4,647,714 | 3/1987 | Goto | 174/36 |
| 4,658,958 | 4/1987 | McNulty et al. | 206/328 |
| 4,699,830 | 10/1987 | White | 428/35 |
| 4,707,414 | 11/1987 | Long et al. | 428/511 |
| 4,708,905 | 11/1987 | Yoshii et al. | 428/216 |
| 4,738,882 | 4/1988 | Rayford et al. | 428/35 |
| 4,746,574 | 5/1988 | Hattori et al. | 428/409 |
| 4,756,414 | 7/1988 | Mott | 206/328 |
| 4,792,042 | 12/1988 | Koehn et al. | 206/328 |
| 4,823,945 | 4/1989 | Adelman | 206/204 |
| 4,848,566 | 7/1989 | Havens et al. | 206/328 |
| 4,875,581 | 10/1989 | Ray et al. | 206/328 |
| 4,906,494 | 3/1990 | Babinee et al. | 428/35.3 |
| 4,999,252 | 3/1991 | Havens et al. | 428/515 |

FOREIGN PATENT DOCUMENTS

| | | |
|---|---|---|
| 0324494 | 7/1989 | European Pat. Off. . |
| 2156362 | 9/1987 | United Kingdom . |
| 2180792 | 8/1989 | United Kingdom . |

OTHER PUBLICATIONS

US 3M 2100 Transparent Stat 3M 2100 Bag 1-6.
US Statshield Trans. Conduct Charleswater Product.
US XT6000 Static Shielding Quality Packaging.
US Conducto-Stat 3220 Maine Poly Inc.
US Simco-State Simco Company.
US Grid Stat 9900 Bags Static Inc.
US Chiploc Dow Chemical.
US Static Shield Bags Ameri-Stat.
US Contrim Crystat Constat Crystal-X Corp.
US Nonstat-PC Bag Fujimori.
US 3M 2100 Bag Construction 3M.
US Chiploc-ES Bag Dow.
US EPG-112 Film Cryovac.
US Electrostatic Properties Fed Test Method 101 C.
US Affidavit Under Rule 132 From 3M's USPs 4154344 & 4156751 to Yenni.
US Transparent Static Shield Baystat Inc.

Primary Examiner—Ellis P. Robinson
Assistant Examiner—Charles R. Nold
Attorney, Agent, or Firm—William D. Lee, Jr.; Jennifer L. Skord; Mark B. Quatt

[57] ABSTRACT

A flexible sheet material and bags made therefrom for packaging electrostatically sensitive items such as electronic circuit boards. The sheet has a metal layer that is adhesively laminated to an antistatic polymeric layer, the instant bag being of improved metal layer to antistatic layer adhesion. The metal outer surface of the bag has a high non-conductive surface resistivity greater than or equal to $10^8$ ohms/square, yet the bag protects the packaged item from static voltage by preventing the capacitive coupling of the voltage through the bag to the item packaged therein.

12 Claims, No Drawings

METALLIZED BAG WITH IMPROVED INTERLAYER ADHESION FOR STATIC PROTECTION OF ELECTRONIC COMPONENTS

FIELD OF THE INVENTION

The invention relates to metallized flexible laminate films, and bags made therefrom for packaging and protecting static sensitive devices, i.e. electronic components such as circuit boards. The bag is made of a thin metal layer and a layer of an antistatic polymeric film. More particularly, the instant invention provides for improved inter-layer adhesion between the metal film and the antistatic film. Moreover, the instant bags work surprisingly well even though the metal outside has a relatively high surface resistivity, which is contrary to the teachings of prior patents. The bags provide excellent protection from the discharge of electrical voltage, not allowing it to couple to an electronic component inside the bag.

BACKGROUND OF THE INVENTION

Some prior patents on metallized envelopes for protection of electronic components are U.S. Pat. No. 4,154,344 (Parent) and U.S. Pat. No. 4,156,751 (Divisional), both issued to Yenni et al, assignors to 3M. Both patents relate to envelopes having an inside antistatic surface with a surface resistivity of $10^8$ to $10^{14}$ ohms/square, a core insulative sheet with a volume resistivity of at least $10^{10}$ ohm-centimeters, and an outside metal conductive surface with a surface resistivity not greater than $10^4$ ohms/square. The 3M patents and the publicly available file histories thereof teach this outside surface has a surface resistivity of no greater than $10^4$ even if there is a polymeric abrasion protection coating on the metal. For instance, 3M's commercially available 2100 bag has from bag outside to bag inside the structure: nickel/insulative polyester/adhesive/antistatic film of LDPE containing antistat. (The patents say the antistat is Ampacet No. 10069.) The nickel bag outside is coated with an ultrathin polymeric abrasion protection coating and still at ambient humidity and temperature the 2100 bag exhibits on the nickel outside a surface resistivity of $10^4$ ohms/square. Such bags are referred to as "metal out".

Also of interest is U.S. Pat. No. 4,756,414 issued in 1988 to Mott, assignor to Dow Chemical. This patent relates to a bag or pouch having a first and second antistatic layer, which antistat layers are the electron beam radiation cured product as taught by British Published patent application 2,156,362 (which is the counterpart of U.S. Pat. No. 4,623,594 issued November 18, 1986 to Keough, assignor to Metallized Products). This electron beam radiation cured antistat film is sold by Metallized Products under the registered trademark Staticure. As per '414, these antistatic layers are bonded along their primary surfaces so that the secondary antistatic surface of one will form the bag outside and the secondary antistatic surface of the other will form the bag inside. At least one primary surface has on it a metal conductive layer, which then due to the sandwiching structure is an internal core of the bag layers. Commercial products like this are referred to as "metal in". For instance, a "metal in" structure is Dow's commercial Chiploc-ES bag, which from the bag outside to the bag inside is of the structure: Staticure/insulative polyester/metal/Staticure /LDPE. Another commercial "metal in" structure is what Fujimori sells as their NONSTAT-PC bag, which from the bag outside to the bag inside is of the structure: antistatic layer/insulative polyester/metal/antistatic layer.

Also of interest is U.S. Pat. No. 4,407,872 issued in 1983 to Horii, assignor to Reiko. This patent relates to an envelope for packaging electronic parts, the envelope having an outside layer of plastic and an inner metal film layer, the metal layer having electrical resistance less than $10^8$ ohms/square centimeter. Optionally on the envelope inside is a heat-sealable resin film layer laminated onto the metal film layer. This also creates a "metal in" sandwich of the structure: plastic layer/metal layer/heat sealing layer.

OBJECTS

Accordingly, it is an object of the invention to provide flexible sheet material, said sheet material comprising a metal layer adhesively laminated to an antistatic polymeric layer, said antistatic layer being made of a film of carboxylic acid copolymer and quaternary amine, said antistatic film being permanently antistatic. It is another object to provide such a sheet material of improved metal layer to antistatic layer adhesion. The sheet material is adaptable for forming a package, bag, envelope, or the like, for receiving an electrostatically sensitive item. When the electrostatically sensitive item is packaged in the sheet material, the package will prevent the capacitive coupling of voltage through the package outside to the item, even though the metal outside of the package has a high, non-conductive surface resistivity of no less than about $10^8$ ohms/square at ambient conditions of about room temperature and 40 to 60% relative humidity. At a "dry" RH of about 15% or less, the surface resistivity on the outside of the package will be no less than about $10^{11}$ ohms/square.

It is also an object of the present invention to provide a method for improving interlayer adhesion between the metal layer and the antistatic polymeric layer of a flexible sheet material adaptable for forming a package, bag, envelope, or the like, for receiving an electrostatically sensitive item. The method involves adhesively laminating the antistatic layer to the metal. It is a feature of the present method that the antistatic layer is made of a film of carboxylic acid copolymer and quaternary amine, said antistatic film being permanently antistatic. The antistatic film defines the inner surface and the metal layer defines the outer surface of the package, bag, envelope or the like.

SUMMARY OF THE INVENTION

Therefore, the present invention provides a flexible sheet material adaptable for forming a package, bag, envelope, or the like, for receiving an electrostatically sensitive item, said sheet material having an outer surface and an inner surface, said sheet material comprising a metal layer adhesively bonded to an antistatic polymeric layer, (a) said antistatic layer defining the inner surface and said metal layer defining the outer surface of the package, bag, envelope or the like, (b) said outer surface providing a high non-conductive surface resistivity no less than about $10^8$ ohms/square at ambient conditions of about room temperature and 40 to 60% relative humidity, whereby said metal layer and said antistatic layer in combination will provide static protection for the electrostatically sensitive item as determined by a capacitive probe test of discharging 1000 volts direct current onto the outer surface, by preventing the voltage from capacitively coupling to the electrostatically sensitive item; and (c) wherein the antistatic layer is made of a film of carboxylic acid copolymer and quaternary amine, said antistatic film being permanently antistatic, whereby said sheet material is of improved metal layer to antistatic layer adhesion.

The present invention also provides a method for improving interlayer adhesion in a flexible sheet material adaptable for forming a package, bag, envelope, or the like, having an outer surface and an inner surface, said sheet material having a metal layer adhesively bonded to an antistatic polymeric layer, said antistatic layer defining the inner surface and said metal layer defining the outer surface of the package, bag, envelope or the like, the method comprising adhesively laminating the antistatic layer to the metal layer, where the antistatic layer is made of a film of carboxylic acid copolymer and quaternary amine, said antistatic film being permanently antistatic, and said outer surface providing a high non-conductive surface resistivity no less than about $10^8$ ohms/square at ambient conditions of about room temperature and 40 to 60% relative humidity, whereby said metal layer and said antistatic layer in combination will provide static protection for the electrostatically sensitive item as determined by a capacitive probe test of discharging 1000 volts direct current onto the outer surface, by preventing the voltage from capacitively coupling to the electrostatically sensitive item.

Also, the present invention provides a packaged electrostatically sensitive item protected from electrostatic charges comprising a static sensitive item having conformed thereabout a flexible sheet material, said sheet material having an outer surface and an inner surface, said sheet material having a metal layer bonded to an antistatic polymeric layer, said antistatic layer defining the inner surface and said metal layer defining the outer surface of the package, (a) said outside surface providing a high non-conductive surface resistivity no less than about $10^8$ ohms/square at ambient conditions of about room temperature and 40 to 60% relative humidity, whereby said metal layer and said antistatic layer in combination will provide static protection for the electrostatically sensitive item as determined by a capacitive probe test of discharging 1000 volts direct current onto the outer surface, by preventing the voltage from capacitively coupling to the electrostatically sensitive item; (b) wherein the antistatic layer comprises a film made of carboxylic acid copolymer and quaternary amine, said antistatic film being permanently antistatic, whereby said sheet material is of improved metal layer to antistatic layer adhesion.

Also, the invention provides a flexible sheet material adaptable for forming a package, bag, envelope, or the like, for receiving an electrostatically sensitive item, said sheet material having an outer surface and an inner surface, said sheet material comprising a metal layer adhesively bonded to an antistatic polymeric layer, (a) said antistatic layer defining the inner surface and said metal layer defining the outer surface of the package, bag, envelope or the like, and (b) said antistatic layer being a multi-ply film having an antistat-free surface ply, the metal layer and antistat-free ply being in adhesive contact.

Also, the invention provides that in a metallized electronic packaging film having a metal layer and an antistatic layer, the antistatic layer is made of a film of carboxylic acid copolymer and quaternary amine, said antistatic film being permanently antistatic, whereby said sheet material is of improved metal layer to antistatic layer adhesion.

Preferably, the metal layer is first deposited on a polymeric insulative layer such as polyester, and this insulative layer is then adhesively bonded to the antistatic layer. The resultant is of the structure: metal/insulative layer/adhesive/antistatic layer.

DETAILED DESCRIPTION OF THE INVENTION

The laminate of the invention, which may be made into envelopes, bags, pouches, and the like for the packaging of static sensitive devices comprises a thin metal layer adhesively laminated to an antistatic polymeric layer.

Suitable metals include, but are not limited to, aluminum, stainless steel, copper, nickel, and mixtures thereof. Preferably the thickness of the metal should be not greater than about 300 angstroms (about 0.0012 mil), more preferably less than about 200 angstroms (about 0.00079 mil), most preferably less than about 125 angstroms (about 0.00049 mil). The thinner the metal layer, the more transparent is the finished bag of metal laminated to antistatic layer. Of course, it is more desirable that the bag be transparent enough so that code numbers printed on the circuit board packaged in the bag can be read.

Suitable thicknesses for the antistatic layer are from about 1 mil to 5 mils (25 microns to 125 microns), preferably about 2 to 4 mils (50 to 100 microns). The antistatic layer is made as per the permanent antistatic films of quaternary amine antistatic agent in a polymer containing carboxylic moieties, such as quaternary amine (QA) in ethylene acrylic acid copolymer (EAA) or in ethylene methacrylic acid copolymer (EMAA), as shown in U.S. patent application Ser. No. 143,885 (Parent) and Ser. No. 249,488 (continuation-in-part), both to Havens and Roberts, assignors to W. R. Grace & Co.-Conn., the disclosures of which are incorporated herein by reference. These two were combined for one foreign filing and their publicly available counterpart is European patent application Publication No. 0324494 published in European Patent Bulletin No. 1989/29, on Jul. 19, 1989. The U.S. Applications and EP Publication 0324494 disclose a film, which film has permanent, non-bleeding antistatic characteristics. By "permanent, non-bleeding" antistatic characteristics is meant the film exhibits a static decay time (hereinafter abbreviated as SDT) under about 3000 milliseconds (hereinafter abbreviated as ms) when the static decay test using 5000 volts direct current (hereinafter abbreviated as Vdc) is performed as per Federal Test Method 101c, Method 4046.1, after a 24-hour water shower, i.e. the antistat property is not washed out by the shower. In the preferred embodiments, the film will also still have this SDT of about 3000 ms or less even after 12 days in a hot (approximately 70° to 71° C.) oven. This antistatic film may be of 5 plies or layers, each ply containing the quaternary amine antistatic agent. Such a 5-ply film is commercially available as EPG-112 from the Cryovac Division of W. R. Grace & Co.-Conn. Optionally, an alternative version of EPG-112 having one or more antistat-free plies may be laminated to the metal. For instance, this version may have an antistat-free surface, wherein EPG-112 has been made with a surface ply free of antistat, this surface ply being a polyolefin. Suitable polyolefins for the one or more antistatfree plies include, but are not limited to, low density polyethylene (LDPE), linear low density polyethylene (LLDPE), ethylene-vinyl acetate copolymer (EVA), high density polyethlyene (HDPE), and the like, or mixtures thereof.

Also, these permanently antistatic films comprising carboxylic acid copolymer and quaternary amine adhesively laminated to aluminum/polyester are disclosed in commonly assigned copending U.S. Ser. No. 450,646 filed Dec. 13, 1989 to inventor Havens, the disclosure of which is incorporated herein by reference. Also, for clarity, pertinent portions of U.S. Ser. No. 450,646 are repeated here.

Between the metal layer and the antistatic layer, there may be a polymeric insulative layer. Preferably, this is a polyester such as a layer of polyethylene terephthalate (PET) or its glycol modified derivative (PETG), or of nylon. This insulative layer should be about 0.2 to 1 mil (about 5.08 to 25.4 microns) thick, preferably about 0.3 to 0.7 mil (about 7.62 to 17.78 microns) thick. Suitable laminates of aluminum metallized polyethylene terephthalate are commercially available from companies such as Scharr or National Metallizers, which aluminum metallized PET can then be laminated to EPG-112 (or laminated to an alternative version of EPG-112). The commercially available laminates of metallized PET are typically made by sputter deposition or vacuum deposition of the metal onto the PET.

As per U.S. Ser. Nos. 143,885 and 249,488 and their counterpart EP Publication 0324494, the polymer containing carboxylic acid moieties and the quaternary amine are combined by mixing with heat. Optionally, a polymer compatible therewith, such as a polyolefin, may be blended in the mixture. Any suitable mixing means may be employed such as a blender or a twin screw extruder. The heat should be from about 50° C. to 290° C., more preferably about 100° C. to 250° C., even more preferably about 100° C. to 200° C. Then the resultant may be formed into a film such as by extrusion methods. The film is permanently antistatic, which means it will dissipate an applied charge of ±5000 Vdc in less than about 3000 ms, more preferably less than 2000 ms, using the static decay time (SDT) method described in Federal Test Method Standard 101c, Method 4046.1, even after a 24 hour water shower. This is unlike prior polymeric films containing an antistatic agent to give them antistatic characteristics, which characteristics can be washed out after a 24 hour water shower because the agents operate by migrating to the surface and attracting moisture. Furthermore, in some embodiments, the films survive 1 day, more preferably 3 days, even more preferably 5 days, and most preferably 12 days in a hot oven at approximately 70° C. to 71° C. and still exhibit this static decay time (SDT) of less than about 3000 ms, more preferably less than about 2000 ms.

Measuring the Antistatic Property of the Antistatic Polymeric Film

The antistatic property is exhibited by the ability of a polymer containing an antistatic agent to promote static charge decay, i.e. to dissipate a static charge. The polymer alone will not dissipate a static charge, but the polymer containing the agent is able to dissipate 99% of an applied static charge of ±5000 volt potential in a short amount of time, i.e. less than 3 seconds, more preferably less than 2 seconds (2000 milliseconds). Federal Test Method Standard 101C, Method 4046.1, "Electrostatic Properties of Materials" states less than 2000 ms and thus it is preferred to have a material that complies with 101C. Decay meters for measuring the time for dissipation of the applied volts are commercially available, such as the 406C static decay meter supplied by Electrotech Systems, Inc. Unless otherwise indicated in the Examples below, the films, prior to testing, were equilibrated at less than about 15% relative humidity (RH), which is considered to be a "dry" atmosphere, at about room temperature (RT) for about 24 to 48 hours. For clarity, it is noted that for metallized films, the SDT test is not relevant. Due to the presence of the metal layer, the SDT will be less than 10 ms, which is statistically insignificant and can be considered as being 0 ms. The appropriate test for metallized films is measuring discharge to ground, as further discussed below.

Measuring Resistivity

Some of the films (both metallized and not metallized) were tested for surface resistivity and volume resistivity according to the method set out in ASTM D257, except that in the Examples, resistivity was measured at a "dry" relative humidity under about 15% RH, unless indicated that it was measured at an ambient 40 to 60% RH.

No Correlation between Resistivity and Static Decay Time

It is noted that there is not necessarily a correlation between the surface or volume resistivity of a polymeric film and the ability of a polymeric film to decay or dissipate charges as per the SDT test. Thus, the term "antistatic" as used herein describes a polymeric film which can dissipate 99% of an applied static charge of ±5000 Vdc in a short amount of time, preferably a static decay time less than about 3 seconds, more preferably less than about 2 seconds (Federal Test Method Standard 101c, Method 4046.1, "Electrostatic Properties of Materials"). If the polymeric film also happens to have an antistatic resistivity, i.e. a surface resistivity of about $10^5$ to $10^{12}$ ohms/square as per the DOD and EIA Standards explained below, then that material will be described using the term "antistatic surface resistivity".

DOD and EIA Standards

The Department of Defense and the Electronics Industry Association have standards on surface resistivity of a material in ohms/square as follows:

Surface Resistivity Ranges (ohms/square)

| Insulative | Antistatic or Static Dissipative | Conductive |
| --- | --- | --- |
| $>10^{12}$ | $10^{12}$ to $10^5$ | $<10^5$ |

It is noted that some of the 5-ply polymeric films as illustrated by U.S. Ser. Nos. 143,885 and 249,488 and their counterpart EP Pub. 0324494 have both a preferred static decay time of about 3000 milliseconds or less and a static dissipative (as opposed to insulative) surface resistivity of $10^{12}$ to $10^5$ ohms/square as per the DOD and EIA Standards, even after a 24-hour water shower or after 12 days in a hot oven. Thus these 5-layer films are permanently antistatic by the definition of static decay time and permanently antistatic by the definition of antistatic surface resistivity; neither the 24-hour water shower nor the 12-day hot oven takes out the "antistatic" characteristic.

Measuring Discharge to Ground; Old Capacitive Probe Test (Human Finger)

The old capacitive probe method (human finger) used to be employed for determining whether an electrical charge will pass through a sheet material and couple to an electronic component. The method of this old test employed a finger of a charged human and thus is less sensitive than the present test method which employs a discharge probe as described below. Although the same charge coupling is measured, use of a human is less sensitive than a discharge probe because interference will occur from such things a whether the human has eaten salty food, whether the human is wearing rubber soled shoes, whether the human is sweaty, and the like.

A printed circuit board having two conductive copper plates separated by a layer of insulated material would be placed inside a metallized bag. Wire leads were attached both to the plates of the circuit board and to the inputs of a dual trace oscilloscope through two matched 100 megaohm 3 picofarad one thousand to one high voltage probes so that the effective channel isolation from ground of the leads was on the order of $10^7$ ohms. Then the scope would be adjusted so the voltage difference between the two plates on the printed circuit board was displayed and stored on the screen of the scope. The total capacitance of the double sided printed circuit board employed was measured. The source for the electrostatic charge used in the test was a person whose body capacitance was measured. The person was charged to a static electrical potential of about 3000 volts for each test. The bag with the circuit board inside was supported on a wooden bench as ground. The charged person discharged himself onto the test bag by placing one finger firmly onto the top of the bag adjacent the top plate of the enclosed circuit board. The scope showed any voltage pulse measurable by coupling to the printed circuit board inside the bag.

Measuring Discharge to Ground; Present Capacitive Probe Test (Test Fixture)

The present method for determining whether an electrical charge will pass through a metallized sheet material and couple to an electronic component is a variation of EIA-541 Appendix E. An Electro-Tech Systems, Inc. shielded bag test fixture Model 402 is fitted with a capacitor of about 25 picofarads which is placed inside a metallized bag. The capacitor simulates an electronic component such as a circuit board that would be stored inside the bag. The bag rests on an aluminum ground plate. Next, an Electro-Tech Systems Model 881 power supply is adjusted to 1000 volts. Then the 1.5 kilo-ohm discharge probe of the test fixture is lowered onto the bag. The capacitor is connected with leads through the test fixture which leads are connected to a 141A oscilloscope from Hewlett-Packard using a 1402 dual trace amplifier, DC 20 MHz. A reading of a few volts, say 10 or less, is statistically insignificant (as this new test is more sensitive than the old human finger method) and considered to be 0 volts and shows the bag performs well.

SUPPLIERS & TRADENAMES OF MATERIALS EXPLOYED IN THE EXAMPLES

| ANTIBLOCK | | INGREDIENTS | | SUPPLIER |
|---|---|---|---|---|
| EPE 8160 | | Polyethylene Containing Micron Sized Silica | | Teknor Apex |
| LLDPE | MI* | DENSITY | COMONOMER | SUPPLIER |
| DOWLEX 2045.03 | 1.1 | 0.920 | Octene | Dow Chemical |
| EVA | MI | %VA | COMONOMER | SUPPLIER |
| LD318.92 | 2.0 | 9 | Vinyl Acetate | Exxon Rexene |
| EAA | MI | % BY WEIGHT ACRYLIC ACID | % BY WEIGHT ETHYLENE | SUPPLIER |
| PRIMACOR 1410 | 1.5 | 9 | 91 | Dow Chemical |
| QA | | FORMULA | | SUPPLIER |
| Larostat 264A Anhydrous | | Modified soyadimethyl ethylammonium ethosulfate, which is $[H(CH_2)_{14-20}|(C_2H_5)N(CH_3)_2 + C_2H_5OSO_3-$ | | Jordan/PPG/ Mazer |

*MI is an abbreviation for melt index.

The following Examples are intended to illustrate the invention and it is not intended to limit the invention thereby.

EXAMPLE I

Laminate of Aluminum Metallized PET to EPC-112

EPC-112 was coextruded, hot blown, 5-layer symmetric film of the structure: A/B/C/B/A made in thicknesses of 2.0, 3.0, and 4.0 mils, where the percentages recited below where in % by weight.

Layer A: Composed of EVA, EAA, antiblock, antistatic agent EVA: 30% of Layer A

| Density: | 0.929 to 0.931 g/ml |
|---|---|
| VA Content: | 9.0 ± 0.5% |
| Melt Index: | 1.8 to 2.2 g/10 min., ASTM D-1238 |

EAA: 52.5% of Layer A

| Density: | 0.938 g/ml |
|---|---|
| Acrylic Acid Content: | 9.5% |

-continued

| Vicat Softening Point: | 180° F. |
| --- | --- |
| Melt Index: | 1.5 ± 0.5 g/10 min., ASTM D-1238 |

Antiblock Masterbatch - Silica Dispersion in Polyethyelene: 10% of Layer A

| Density of Antiblock Masterbatch: | 0.96 to 0.98 g/ml |
| --- | --- |
| Melting Point of Masterbatch: | Unknown |
| Silica Content: | 10% |
| Melt Index of Masterbatch: | 3.90 to 4.14 g/10 min., ASTM D-1238 |

Antistat: Modified Soya Dimethylethlammonium Ethosulfate: 7.5% of Layer A

| Density of Antistat: | 1.005 g/ml @25° C. |
| --- | --- |
| pH 35% Solution in Water: | 6.0-6.9 @25° C. |
| Boiling Point: | >300° F. |
| Melting Point: | 120° F. |

Layer B: Composed of EVA, EAA, and Antistatic Agent EVA: 67% of layer B

Same EVA as layer A

EAA: 24.7% of layer B

Same EAA as layer A

Antistatic Agent: 8.3% of layer B

Same antistatic agent as layer A

Layer C: Composed of LLDPE, EAA, Antistatic Agent LLDPE: 90% of layer C

| Density: | 0.918 to 0.922 g/ml |
| --- | --- |
| Melting Point: | 123-126° C., DSC 2nd heat |
| Melt Index: | 1.1 ± 1 g/10 min. |
| Octene Comonomer Content: | 6.5 ± 0.5% |

EAA: 7.5% of layer C

Same EAA as layer A

Antistatic Agent: 2.5% of layer C

Same antistatic agent as layer A 4 mil EPG-112 was adhesively laminated to Scharr's commercial 48 gauge (0.48 mil) aluminum metallized polyester on the polyester side, using a polyurethane adhesive (commercially available under the tradename Korolam 880X301 or Korolam 880X388 from DeSoto Chemical, Chicago Heights, Ill.), to make a laminate of the structure:

aluminum/polyester/adhesive/antistatic film.

Bags were made by heat-sealing together on three edges two sections of the laminate; the antistatic film side was the sealing layer. Bags were sufficiently transparent to afford visual identification of an electrical component inside.

Results of electrical measurements at room temperature on the laminate of aluminum/polyester/antistatic EPG-112, as well as on EPG-112 and on the metallized polyester were as follows (NT means that measurement was not tested):

| Laminate | Aluminum Side | | Antistatic Film Side | |
| --- | --- | --- | --- | --- |
| | 60% RH | 12% RH | 60% RH | 12% RH* |
| surface resistivity ohms/sq | 1 × 10$^8$ | 7.0 × 10$^{11}$ | 7.8 × 10$^9$ | 3.7 × 10$^{11}$ |
| volume resistivity ohms-cm | 4.7E11 | NT | 1.7 × 10$^{13}$ | 5.6 × 10$^{16}$ |
| SDT ms | NT | NT | NT | less than 10 |

| EPG-112 | Antistatic Film | |
| --- | --- | --- |
| | 60% RH | 12% RH |
| surface resistivity ohms/sq | NT | 3 × 10$^{11}$ |
| SDT ms. | NT | 450 |

| Metallized Polyester | Aluminum Side | | Polyester Side | |
| --- | --- | --- | --- | --- |
| | 60% RH | 12% RH | 60% RH | 12% RH |
| surface resistivity ohms/sq | 1 × 10$^8$ | NT | off scale** | NT |
| volume resistivity ohms-cm | 3 × 10$^{14}$ | NT | off scale | NT |

| PET | ***As Reported in Modern Plastics Encyclopedia |
| --- | --- |
| surface resistivity ohms/sq | >10$^{14}$ |
| volume resistivity ohms-cm | >10$^{16}$ |

*RH is an abbreviation for relative humidity. A moist humid atmosphere increases conductivity. Thus at a "humid" ambient 40 to 60% RH, resistivity should be lower than at a "dry" atmosphere of 12% RH.
**The maximum meter scale reads to 10$^{16}$. Thus, off scale means a resistivity of at least 10$^{16}$.
***It is not possible to pull the polyester cleanly off the aluminum to obtain a reading on polyester alone; therefore, reported measurements on PET were taken from the Encyclopedia, 1985-86, page 563, vol. 62, Schulman (Supplier), Arnite (tradename for polyethylene glycol terephthalate).

This adhesive lamination of the EPG-112 to the aluminum metallized polyester was also repeated by adhesively laminating the aluminum side (as opposed to the PET side) of the PET/aluminum to EPG112. This was of the structure:

PET/aluminum/adh/antistatic film.

Surface resistivity on the PET side was 3.4×10$^{12}$ ohms/square.

EXAMPLE II

Another metallized laminate with 5-layer antistatic film was made as in Example I using 48 gauge (0.48 mil) aluminum metallized PET commercially available from Scharr, which was corona treated and then adhesively laminated with polyurethane adhesive to an antistatic film that was an alternative version of EPG-112. In the alternative, 1 of the 5 layers of EPG-112, a surface layer D, was instead made of ethylene-vinyl acetate copolymer free of any quaternary amine antistatic agent. Thus, the alternative antistatic film was of the structure: D/B/C/B/A, where D was the 100% EVA ply. The EVA was commercially available from Rexene. The 100% EVA side was laminated to the PET side of the PET/aluminum. This was of the structure:

aluminum/PET/adh/antistatic film.

Surface resistivity on the aluminum side was $4.1 \times 10^{11}$.

This was also repeated by instead laminating the aluminum side of the PET/aluminum to the EVA surface of the 5-ply antistatic film. This was of the structure:

PET/aluminum/adh/antistatic film.

Surface resistivity on the PET side was off scale.

EXAMPLE III

Another metallized laminate with 5-layer antistatic film was made as in Example I using 48 gauge (0.48 mil) aluminum metallized PET commercially available from Scharr, which was corona treated and then adhesively laminated with polyurethane adhesive to an antistatic film that was an alternative version of EPG-112. In the alternative, 1 of the 5 layers of EPG-112, a surface layer D, was instead made of ethylene-vinyl acetate copolymer free of any quaternary amine antistatic agent. Thus, the alternative antistatic film was of the structure: D/B/C/B/A, where D was the 100% EVA ply. The EVA was commercially available from Exxon. The 100% EVA side was laminated to the PET side of the PET/aluminum. This was of the structure:

aluminum/PET/adh/antistatic film.

Surface resistivity on the aluminum side was $2.4 \times 10^{11}$.

This was repeated by instead laminating the aluminum side of the PET/aluminum to the EVA surface of the 5-layer antistatic film. This was of the structure:

PET/aluminum/adh/antistatic film.

Surface resistivity on the PET side was $7.8 \times 10^{12}$.

EXAMPLE IV

Another metallized laminate with 5-layer antistatic film was made as in Example I using 48 gauge (0.48 mil) aluminum metallized PET commercially available from National Metallizers, which was then adhesively laminated with polyurethane adhesive to an antistatic film that was an alternative version of EPG-112. In the alternative, the composition of ply B was not used and also 1 of the 5 layers of EPG-112, a surface layer D, was instead made of ethylene-vinyl acetate copolymer free of any quaternary amine antistatic agent. Thus, the alternative antistatic film was of the structure: D/A/C/A/A, where D was the 100% EVA ply. The EVA was commercially available from Exxon. The 100% EVA side was laminated to the PET side of the PET/aluminum. This was of the structure:

aluminum/PET/adh/antistatic film.

This was repeated by instead laminating the aluminum side of the PET/aluminum to the EVA surface of the 5-layer antistatic film. This was of the structure:

PET/aluminum/adh/antistatic film.

COMPARATIVE EXAMPLE A VERSUS EXAMPLE I

A bag of the structure from outside to inside: aluminum/PET/adhesive/EPG-112 as per Example I was compared to 3M's commercially available 2100 metallized bag of the structure: nickel/insulative polyester/adhesive/antistatic film of LDPE containing antistat. The 2100 bag has been advertised as having a thin polymeric abrasion protection coating on the nickel outside surface of the bag, and having on this outside surface a resistivity at ambient conditions of $10^4$ ohms/square. Not greater than $10^4$ ohms/square also is what is claimed in the above mentioned 3M U.S. Pat. Nos. 4,154,344 and 4,156,751. In contrast, as seen from Example I, the Al/PET/adhesive/EPG-112 had on its Al outside surface a resistivity of $1 \times 10^8$ ohms/sq at ambient RH, and about $7 \times 10^{11}$ ohms/sq at a "dry" 12% RH. Although it is not known why and not intended to be bound to any theory, it is theorized this occurred because aluminum, when exposed to air, quickly forms an insulator of $Al_2O_3$; thus due to the presence of the $Al_2O_3$, the bag outside showed $1 \times 10^8$.

Next, a capacitive probe test was performed on both the bag of the structure from outside to inside: aluminum/PET/adhesive/EPG-112 made as per Example I and the 3M 2100 bag with the new method of the Electro-Tech Systems shielded bag test fixture Model 402, not the old human finger method. The Example I bag provided readings ranging from 4 to 6 volts, whereas the commercially available 3M 2100 bag provided readings ranging from 2 volts to 4 volts. As mentioned above, this new method is more sensitive than the old human finger method. Thus, these small voltages are not statistically significant and can be considered as a 0 voltage reading when using the old human finger test method.

This data is summarized in the Table below as follows:

| COMPARATIVE TABLE A | | |
|---|---|---|
| Sample | Surface Resistivity Ohms/Square on Metal Outside Surface (Ambient RH) | Capacitive Probe Test Voltage Read on Scope |
| Aluminum/PET/ADH/EPG-112 | $1 \times 10^8$ | 4 to 6 |
| 3M's 2100 | $10^4$ | 2 to 4 |

Accordingly, the material of the instant invention clearly protected a static sensitive device (the capacitive probe test was excellent) even though the material had a high surface resistivity of $10^8$, clearly beyond the not greater than $10^4$ taught by the 3M patents.

COMPARATIVE EXAMPLE B VERSUS EXAMPLES I, III, & IV

The metal out structures of aluminum/PET/adhesive/antistatic film of Examples I, III, and IV were compared to various commercially available metal out bag materials for the test of inter layer adhesive lamination strength. All these commercial metal out bags were, from bag outside to bag inside, of the structure: metal/PET/adhesive/antistatic polymeric layer. One inch wide samples were cut. With the aid of solvents such as hexane, the metallized polyester was separated on its polyester side from its adhesive lamination to the antistatic film, for a distance of about 1 inch (about 2.54 cm) with the remainder of the separated portions forming grip tabs. After the solvent was dried and removed so that it would not affect the results, one tab was placed in one jaw of an Instron test fixture and the other tab in the other jaw. The jaws were then separated and the threshold force to pull the layers apart was recorded. This is summarized in the Table below as follows, where "TEAR OUT" indicates the material would not separate at the adhesive, but tore at some other ply.

| SAMPLE | COMPARATIVE TABLE B FORCE (POUNDS) | | | |
|---|---|---|---|---|
| | TRIAL 1 DAY 1 | TRIAL 2 DAY 7 | TRIAL 3 DAY 15 | TRIAL 4 DAY 28 |
| EXAM I | 0.7892 | | | |
| EXAM III | TEAR OUT | | | |
| EXAM IV | TEAR OUT | TEAR OUT | TEAR OUT | TEAR OUT |
| 3M | 0.2777 | | | |
| Richmond 4200 | 0.5923 | | | |
| Richmond 4250 | 0.2837 | | | |
| Simco 2854 | 1.0050 | | | |

Clearly the "metal out" material of the instant invention was better in adhesive lamination to the antistatic film than the commercially available metal out bags were.

While certain representative embodiments and details have been shown for the purpose of illustration, numerous modifications to the formulations described above can be made without departing from the invention disclosed.

What is claimed is:

1. A flexible sheet material adaptable for forming a package, bag, or envelope, for receiving an electrostatically sensitive item, said sheet material having an outer surface and an inner surface, said sheet material comprising an aluminum metal layer adhesively bonded to an antistatic polymeric layer, (a) said antistatic layer defining the inner surface and said aluminum metal layer defining the outer surface of the package, bag, or envelope, (b) said outer aluminum surface, due to the presence of $Al_2O_3$ on said outer aluminum surface, providing a high non-conductive surface resistivity no less than about $10^8$ ohms/square at ambient conditions of about room temperature and 40 to 60% relative humidity, whereby said metal layer and said antistatic layer in combination will provide static protection for the electrostatically sensitive item as determined by a capacitive probe test of discharging 1000 volts direct current onto the outer surface, by preventing the voltage from capacitively coupling to the electrostatically sensitive item; and (c) wherein the antistatic layer is made of a film of carboxylic acid copolymer and quaternary amine, said antistatic film being permanently antistatic, whereby said sheet material is of improved metal layer to antistatic layer adhesion.

2. The sheet material of claim 1, wherein from outer surface to inner surface, the material is of the multilayer structure: metal/insulative layer/adhesive/antistatic polymeric layer.

3. The sheet material of claim 1, wherein the metal layer thickness is not greater than about 300 angstroms, and the antistatic layer thickness if from about 25 microns to about 125 microns.

4. The sheet material of claim 1, wherein the antistatic film made of acid copolymer and quaternary amine has more than one ply, including a surface ply that is a polyolefinic material free of antistatic agent.

5. A method for improving interlayer adhesion in a flexible sheet material adaptable for forming a package, bag, or envelope, having an outer surface and an inner surface, said sheet material having an aluminum metal layer adhesively bonded to an antistatic polymeric layer, said antistatic layer defining the inner surface and said aluminum metal layer defining the outer surface of the package, bag, or envelope, the method comprising adhesively laminating the antistatic layer to the metal layer, where the antistatic layer is made of a film of carboxylic acid copolymer and quaternary amine, said antistatic film being permanently antistatic, and said outer aluminum surface, due to the presence of $Al_2O_3$ on said outer aluminum surface, providing a high non-conductive surface resistivity no less than about $10^8$ ohms/square at ambient conditions of about room temperature and 40 to 60% relative humidity, whereby said metal layer and said antistatic layer in combination will provide static protection for the electrostatically sensitive item as determined by a capacitive probe test of discharging 1000 volts direct current onto the outer surface, by preventing the voltage from capacitively coupling to the electrostatically sensitive item.

6. The method according to claim 5, wherein from outer surface to inner surface, the material is of the multilayer structure: metal/insulative layer/adhesive/antistatic polymeric layer.

7. The method according to claim 5, wherein the metal layer thickness is not greater than about 300 angstroms, and the antistatic layer thickness is from about 25 microns to about 125 microns.

8. The method according to claim 5, wherein the antistatic film made of acid copolymer and quaternary amine has more than one ply, including a surface ply that is a polyolefinic material free of antistatic agent.

9. A packaged electrostatically sensitive item protected from electrostatic charges comprising a static sensitive item having conformed thereabout a flexible sheet material, said sheet material having an outer surface and an inner surface, said sheet material having an aluminum metal layer adhesively bonded to an antistatic polymeric layer, said antistatic layer defining the inner surface and said aluminum metal layer defining the outer surface of the package, (a) said outside aluminum surface, due to the presence of $Al_2O_3$ on said outside aluminum surface, providing a high non-conductive surface resistivity no less than about $10^8$ ohms/square at ambient conditions of about room temperature and 40 to 60% relative humidity, whereby said aluminum metal layer and said antistatic layer in combination will provide static protection for the electrostatically sensitive item as determined by a capacitive probe test of discharging 1000 volts direct current onto the outer surface, by preventing the voltage from capacitively coupling to the electrostatically sensitive item; (b) wherein the antistatic layer comprises a film made of carboxylic acid copolymer and quaternary amine, said antistatic film being permanently antistatic, whereby said sheet material is of improved metal layer to antistatic layer adhesion.

10. The packaged item of claim 9, further including an adhesive layer, wherein from outer surface to inner surface, the material is of the multilayer structure: metal/insulative layer/adhesive/antistatic polymeric layer.

11. The packaged item of claim 9, wherein the metal layer thickness is not greater than about 300 angstroms, and the antistatic layer thickness is from about 25 microns to about 125 microns.

12. The packaged item of claim 9, wherein the antistatic film made of acid copolymer and quaternary amine has more than one ply, including a surface ply that is a polyolefinic material free of antistatic agent.

* * * * *